United States Patent
Kang et al.

(10) Patent No.: US 8,373,987 B2
(45) Date of Patent: Feb. 12, 2013

(54) AIR CONDITIONING SYSTEM OF PORTABLE DATA CENTER

(75) Inventors: Ming-Feng Kang, Taoyuan Hsien (TW); Yung-Hung Tsou, Taoyuan Hsien (TW)

(73) Assignee: Delta Electronics, Inc., Taoyuan Hsien (TW)

(*) Notice: Subject to any disclaimer, the term of this patent is extended or adjusted under 35 U.S.C. 154(b) by 194 days.

(21) Appl. No.: 12/969,793

(22) Filed: Dec. 16, 2010

(65) Prior Publication Data

US 2011/0146964 A1 Jun. 23, 2011

Related U.S. Application Data

(60) Provisional application No. 61/287,328, filed on Dec. 17, 2009.

(51) Int. Cl.
*H05K 7/20* (2006.01)
(52) U.S. Cl. .............. 361/695; 454/184; 312/223.2; 181/283
(58) Field of Classification Search .......... 361/676–678, 361/679.46, 679.48–679.51, 688–697
See application file for complete search history.

(56) References Cited

U.S. PATENT DOCUMENTS

| | | | |
|---|---|---|---|
| 6,110,245 A * | 8/2000 | Schlag et al. ............. | 55/385.6 |
| 6,481,527 B1 * | 11/2002 | French et al. .............. | 181/201 |
| 6,554,697 B1 * | 4/2003 | Koplin ..................... | 454/184 |
| 6,587,340 B2 * | 7/2003 | Grouell et al. ............ | 361/695 |
| 6,776,706 B2 * | 8/2004 | Kipka et al. .............. | 454/184 |
| 7,907,403 B2 * | 3/2011 | Malone et al. ............ | 361/695 |
| 2003/0224717 A1 * | 12/2003 | Tsai et al. ................. | 454/184 |
| 2004/0130868 A1 * | 7/2004 | Schwartz et al. ......... | 361/687 |
| 2005/0241810 A1 * | 11/2005 | Malone et al. ............ | 165/122 |
| 2009/0262499 A1 * | 10/2009 | Chou ....................... | 361/695 |
| 2011/0149513 A1 * | 6/2011 | Silvennoinen et al. ... | 361/695 |

* cited by examiner

*Primary Examiner* — Courtney Smith
(74) *Attorney, Agent, or Firm* — Kirton McConkie; Evan R. Witt

(57) ABSTRACT

An air conditioning system of a portable data center includes a shipping container, plural data-processing devices and plural airflow-driving devices. The shipping container includes a partition plate and a bottom plate. The partition plate has plural hollow portions. The data-processing devices are disposed on the partition plate. The airflow-driving devices are disposed under the partition plate and aligned with respective hollow portions for driving and guiding airflow to cool the data processing devices. Each of the airflow-driving devices includes at least one fan and an airflow-blocking structure. The airflow-blocking structure is arranged in an airflow path of a corresponding airflow-driving device. If one of the airflow-driving devices is disabled, the airflow-blocking structure of the disabled airflow-driving device is automatically closed to hinder the airflow path.

8 Claims, 7 Drawing Sheets

AIR CONDITIONING SYSTEM OF PORTABLE DATA CENTER

CROSS-REFERENCE TO RELATED APPLICATION

This application claims the benefit of U.S. Provisional Application No. 61/287,328 filed on Dec. 17, 2009, and entitled "AIR-DRIVING DEVICE OF PORTABLE DATA CENTER", the entirety of which is hereby incorporated by reference.

FIELD OF THE INVENTION

The present invention relates to an air conditioning system, and more particularly to an air conditioning system of a portable data center.

BACKGROUND OF THE INVENTION

A data center is a facility to house data processing devices and associated components such as computers, servers, network devices and storage devices. The data center is designed to provide a controlled environment for efficient operations of the data processing devices. To increase the convenience, a portable data center is developed, wherein the data processing devices are installed within a shipping container. During operations of the data processing devices, a substantial amount of heat is generated. If the heat is not effectively dissipated, the performance of the data processing devices will be deteriorated. It is critical to adjust the operating conditions of the data center.

FIG. 1 is a schematic view illustrating an air conditioning system of a portable data center according to the prior art. The portable data center 10 comprises a shipping container (not shown), plural data processing devices 11 and plural airflow-driving devices 12. The data processing devices 11 are for example computers, servers, network devices, and the like. The airflow-driving devices 12 are configured to drive and guide airflow to cool the data processing devices 11. The shipping container further includes a partition plate 13 and a bottom plate 14. The partition plate 13 has plural hollow portions (not shown). The data-processing devices 11 are disposed on the partition plate 13. The airflow-driving devices 12 are disposed under the partition plate 13 and aligned with respective hollow portions. A gap is defined between the partition plate 13 and the bottom plate 14. Consequently, the airflow may be transported through a bottom space 15 between the partition plate 13 and the bottom plate 14.

During normal operations of the airflow-driving devices 12, the airflow driven by the airflow-driving devices 12 is guided toward the data processing devices 11 to cool the data processing devices 11. The heated airflow from the data processing devices 11 is guided downwardly to the bottom space 15. Then, the heated airflow is cooled by a heat exchanger (not shown), which is disposed within the bottom space 15. The cooled airflow exited from the heat exchanger is driven and guided upwardly by the airflow-driving devices 12. That is, during normal operations of the airflow-driving devices 12, the airflow is circulated within the shipping container along the normal airflow path to increase the cooling efficacy.

The air conditioning system of the portable data center, however, still has some drawbacks. For example, in a case that one of the airflow-driving devices 12 is disabled (in a standby status or a maintaining status, or breakdown), the original airflow path is altered into a low flow-resistance airflow path. Please refer to FIG. 1. For clarification, only three airflow-driving devices 12 are shown. The middle airflow-driving device 12 is disabled. A portion of the cooled airflow outputted from the left airflow-driving device 12 and a portion of the cooled airflow outputted from the right airflow-driving device 12 may be backwardly introduced into the airflow outlet of the disabled airflow-driving device 12 and exhausted out of the airflow inlet. In this situation, a small amount of cooled airflow is suffered from a short-circulating problem. If the short-circulating problem occurs, the cooling efficacy of the adjacent airflow-driving devices 12 will be deteriorated.

Therefore, there is a need of providing an air conditioning system of a portable data center so as to obviate the drawbacks encountered from the prior art.

SUMMARY OF THE INVENTION

The present invention provides an air conditioning system of a portable data center for avoiding occurrence of the short-circulating problem if one of the airflow-driving devices is disabled, thereby increasing the cooling efficacy.

In accordance with an aspect of the present invention, there is provided an air conditioning system of a portable data center. The air conditioning system includes a shipping container, plural data-processing devices and plural airflow-driving devices. The shipping container includes a partition plate and a bottom plate. The partition plate has plural hollow portions. The data-processing devices are disposed on the partition plate. The airflow-driving devices are disposed under the partition plate and aligned with respective hollow portions for driving and guiding airflow to cool the data processing devices. Each of the airflow-driving devices includes at least one fan and an airflow-blocking structure. The airflow-blocking structure is arranged in an airflow path of a corresponding airflow-driving device. If one of the airflow-driving devices is disabled, the airflow-blocking structure of the disabled airflow-driving device is automatically closed to hinder the airflow path.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
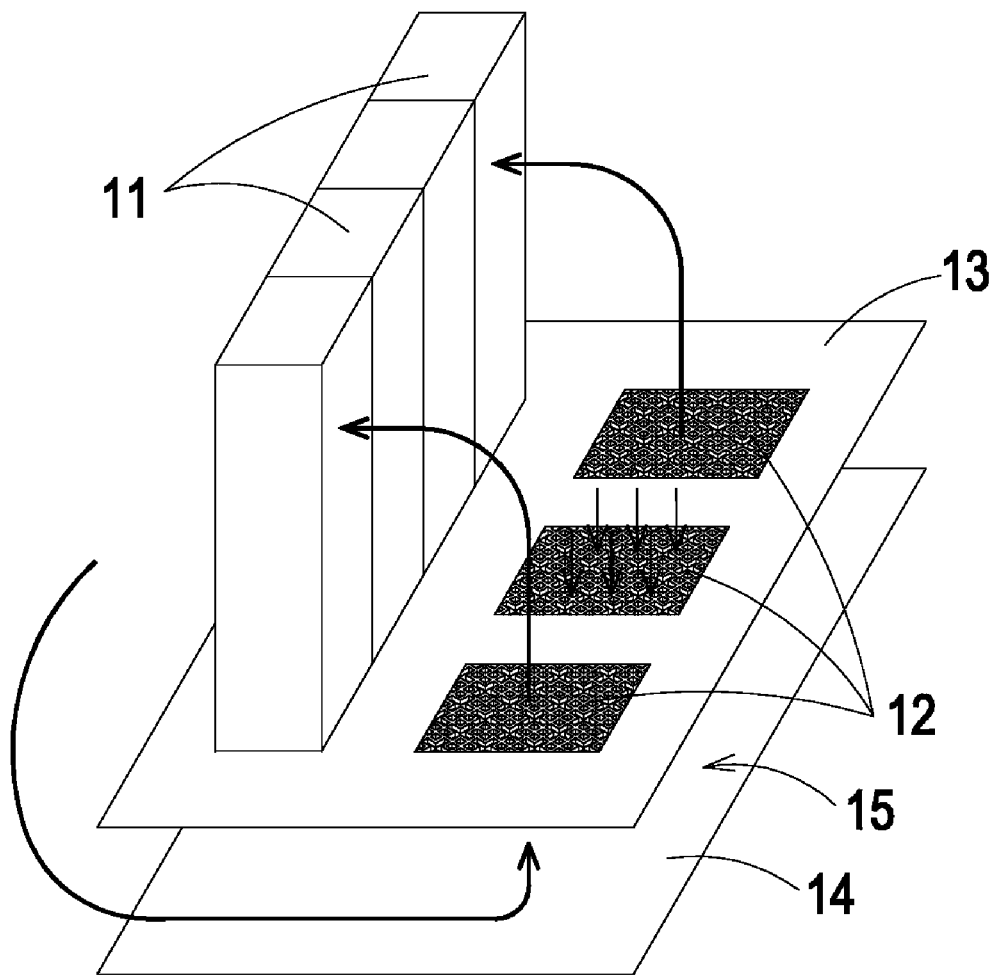
FIG. 1 is a schematic view illustrating an air conditioning system of a portable data center according to the prior art.
Figure 2:
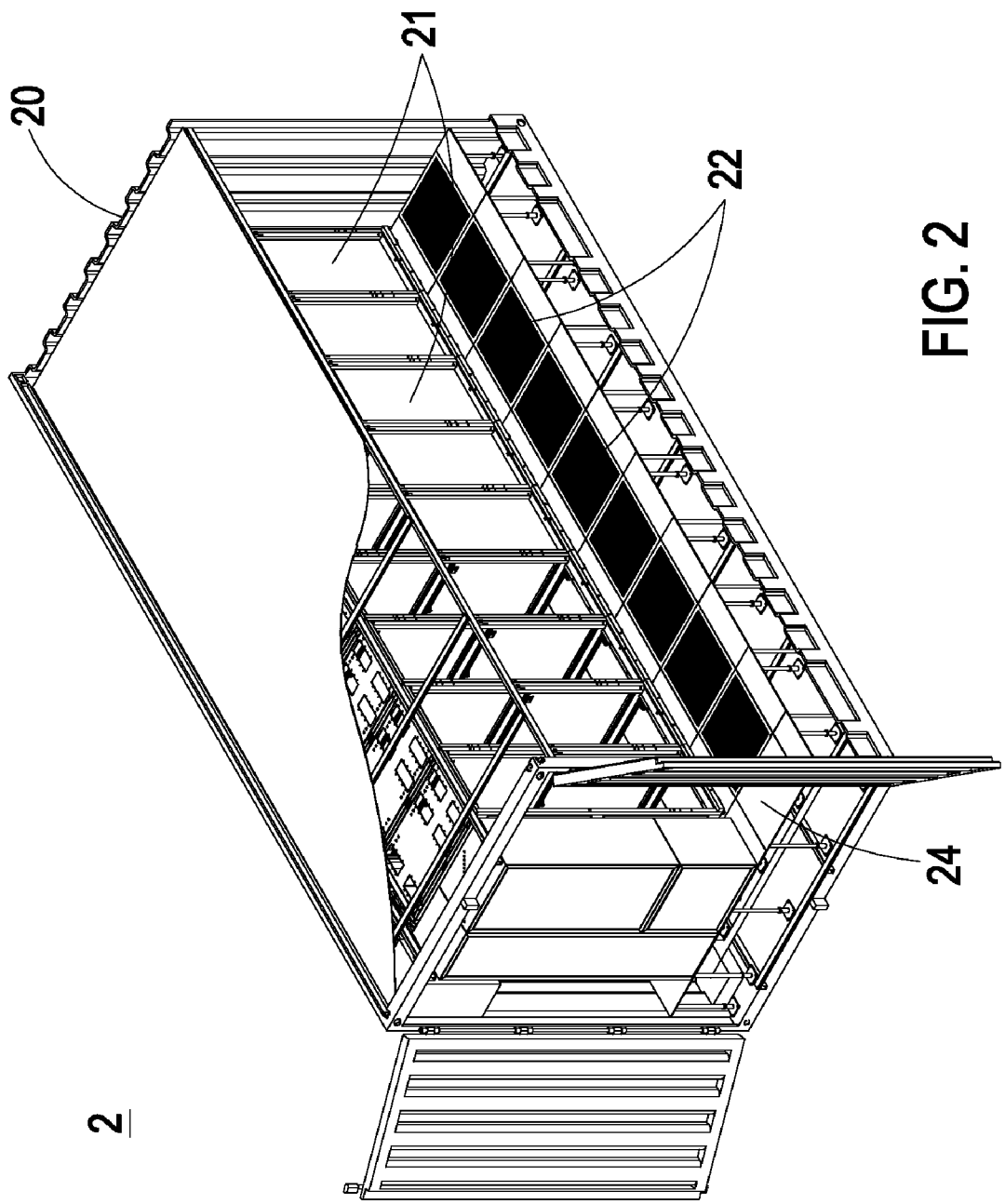
FIG. 2 is a schematic cutaway view illustrating an air conditioning system of a portable data center according to the present invention.
Figure 3:
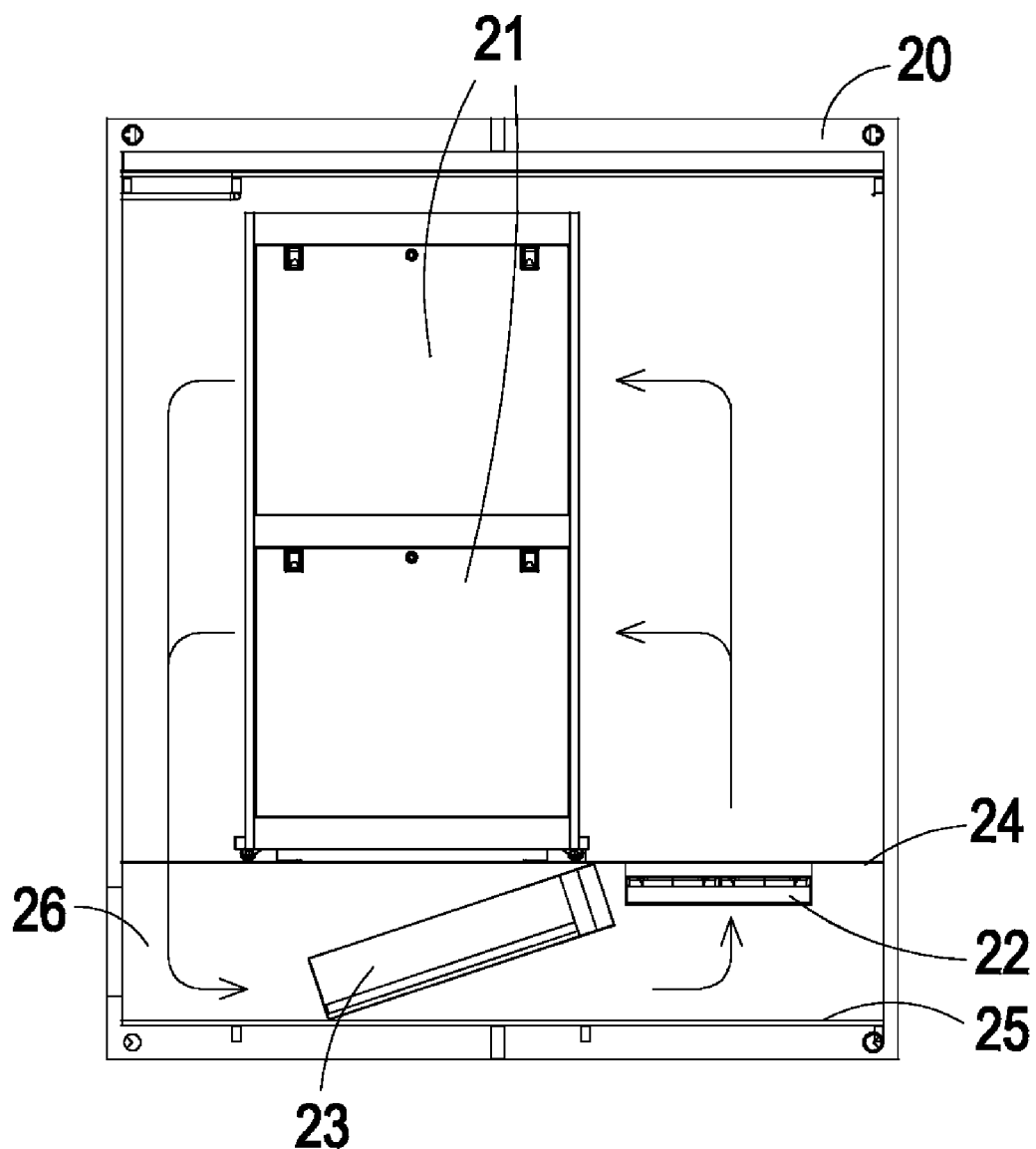
FIG. 3 is a cross-sectional view illustrating the air conditioning system of FIG. 2.

FIG. 2 is a schematic cutaway view illustrating an air conditioning system of a portable data center according to the present invention. FIG. 3 is a cross-sectional view illustrating the air conditioning system of FIG. 2. Please refer to FIGS. 2 and 3. The air conditioning system of the portable data center 2 comprises a shipping container 20, plural data processing devices 21, plural airflow-driving devices 22 and at least one heat exchanger 23. For clearly showing the internal structure of the shipping container 20, the door of the shipping container 20 is opened and a portion of sidewall is omitted (see FIG. 2). During operation of the portable data center 2, the door of the shipping container 20 is closed in order to control the operating conditions of the portable data center 2.

The data processing devices 21 are for example computers, servers, network devices, and the like. The airflow-driving devices 22 are configured to drive and guide airflow to cool the data processing devices 21. The shipping container 20 further includes a partition plate 24 and a bottom plate 25. The partition plate 24 has plural hollow portions (not shown). The data-processing devices 21 are disposed on the partition plate 24. The airflow-driving devices 22 are disposed under the partition plate 24 and aligned with respective hollow portions. The heat exchanger 23 is disposed under the partition plate 24. A gap is defined between the partition plate 24 and the bottom plate 25. Consequently, the airflow may be transported through a bottom space 26 between the partition plate 24 and the bottom plate 25, and cooled by the heat exchanger 23.

During normal operations of the airflow-driving devices 22, the airflow driven by the airflow-driving devices 22 is guided toward the data processing devices 21 to cool the data processing devices 21. The heated airflow exited from the data processing devices 21 is guided downwardly to the bottom space 26. Then, the heated airflow is cooled by the heat exchanger 23, which is disposed within the bottom space 26. The cooled airflow exited from the heat exchanger 23 is driven and guided upwardly by the airflow-driving devices 22. That is, during normal operations of the airflow-driving devices 22, the airflow is circulated within the shipping container 20 along the normal airflow path to increase the cooling efficacy.

As previously described, in a case that one of the airflow-driving devices 22 is disabled (in a standby status or a maintaining status, or breakdown), the original airflow path is altered into a low flow-resistance airflow path. In this situation, a small amount of cooled airflow is suffered from a short-circulating problem. If the short-circulating problem occurs, the cooling efficacy of the adjacent airflow-driving devices 22 will be deteriorated. For avoiding the short-circulating problem, an airflow-blocking structure (see FIG. 4) is arranged in the airflow path of a corresponding airflow-driving device 22.

Figure 4:
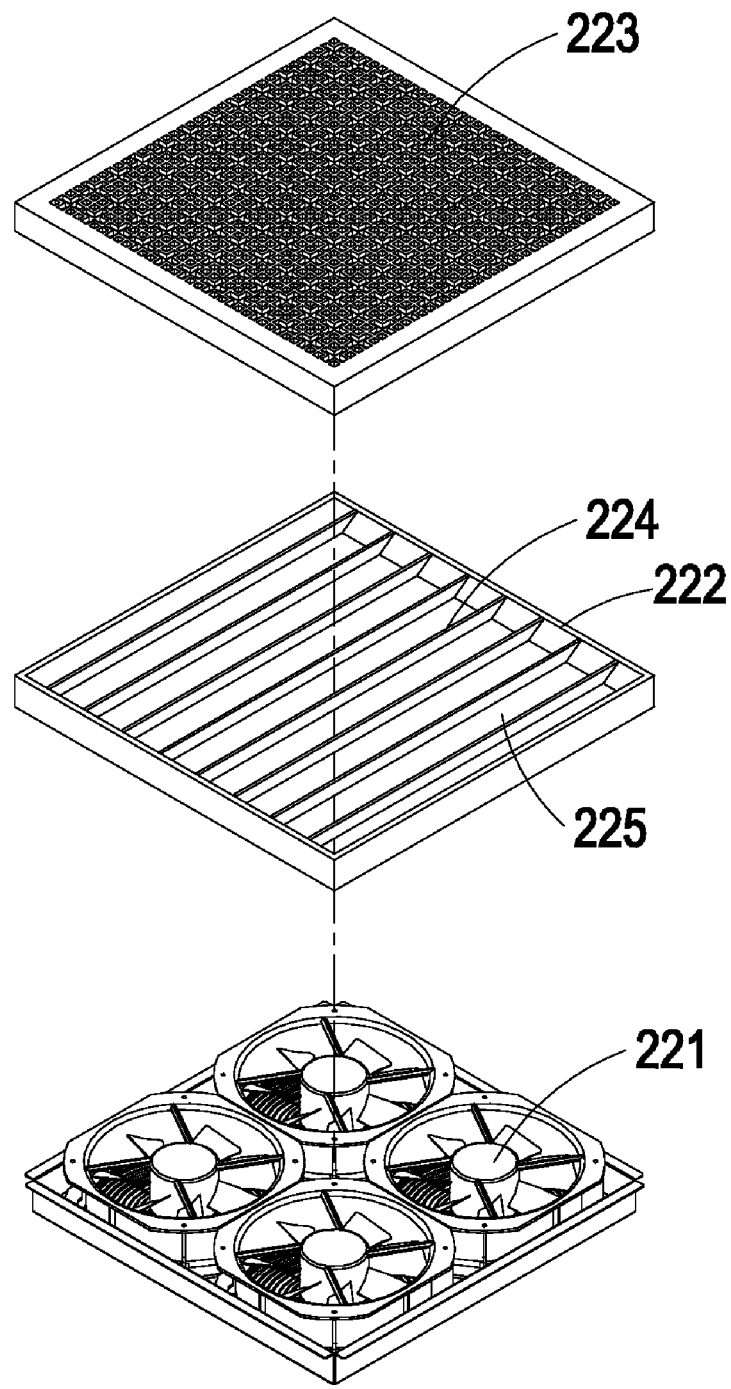
FIG. 4 is a schematic exploded view illustrating an airflow-driving device used in the air conditioning system of the portable data center according to the present invention.

FIG. 4 is a schematic exploded view illustrating an airflow-driving device used in the air conditioning system of the portable data center according to the present invention. As shown in FIG. 4, the airflow-driving device 22 comprises at least one fan 221, an airflow-blocking structure 222 and a mesh guard 223. The airflow-blocking structure 222 is arranged in the airflow path of the fan 221 of a corresponding airflow-driving device 22. For example, airflow-blocking structure 222 is arranged adjacent to the airflow outlet of the fan 221 for adjusting the airflow path. In this embodiment, the airflow-blocking structure 222 is an air gate with plural movable leaves 224. By adjusting the leaves 224 to be substantially parallel with the airflow direction, plural channels 25 are defined between the leaves 224. During normal operations of the fans 221, the airflow driven by the fans 221 can be transported through the channels 225 and guided toward the data processing devices 21 to cool the data processing devices 21. The mesh guard 223 is disposed on the airflow-blocking structure 222 to cover the airflow-blocking structure 222, so that the mesh guard 223 is used as a protecting cover of the airflow-blocking structure 222. In addition, the mesh guard 223 has plural vents. In other words, the airflow driven by the fans 221 can be successively transported through the channels 225 and the vents of the mesh guard 223, and guided toward the data processing devices 21.

Figure 5:
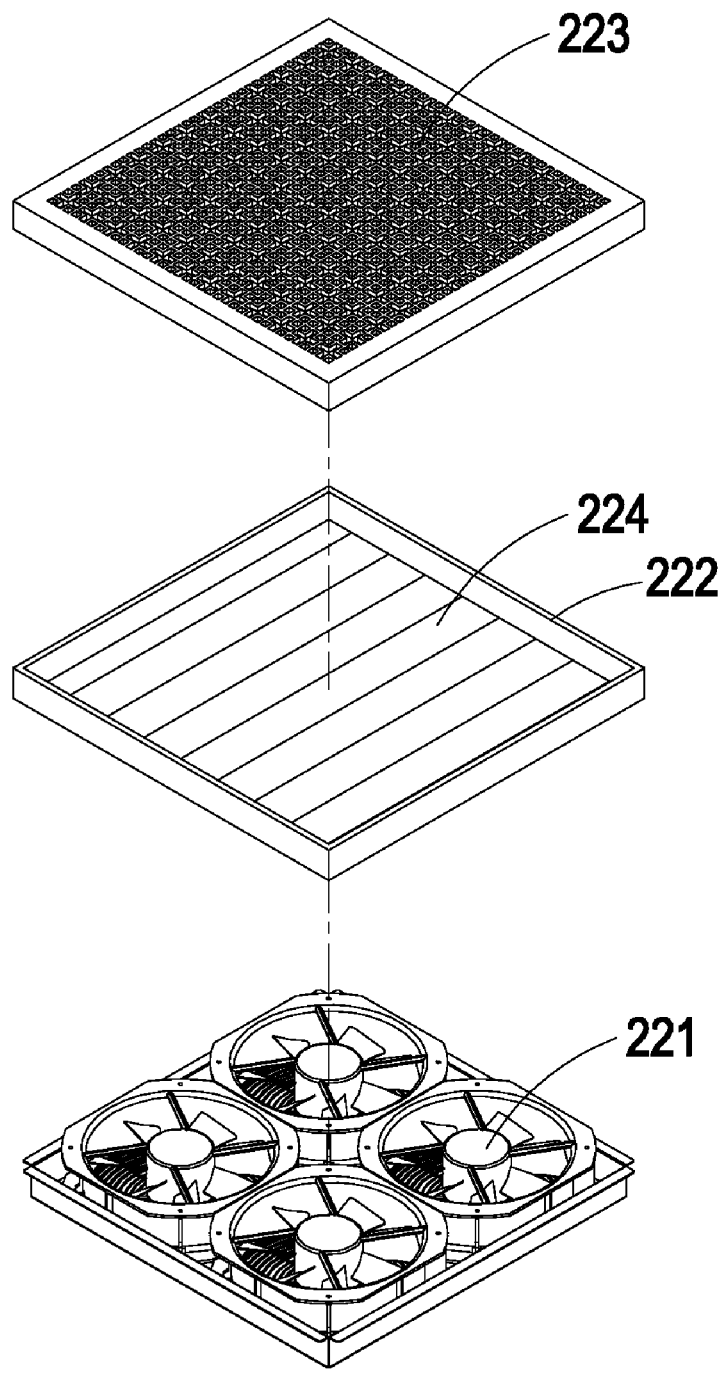
FIG. 5 is a schematic exploded view illustrating the airflow-driving device of FIG. 4, in which the channels of the airflow-blocking structure 222 are closed.

FIG. 5 is a schematic exploded view illustrating the airflow-driving device of FIG. 4, in which the channels of the airflow-blocking structure 222 are closed. In a case that one of the airflow-driving devices 22 is disabled (in a standby status or a maintaining status, or breakdown), the airflow-blocking structure 222 of the disabled airflow-driving device 22 is controlled by a controller (see FIG. 6) to be automatically closed. By closing the airflow-blocking structure 222, the occurrence of the possible low flow-resistance airflow path is eliminated. Consequently, the cooled airflow driven by other normally-operating airflow-driving devices 22 will be circulated along the normal path while increasing the cooling efficacy.

Figure 6:
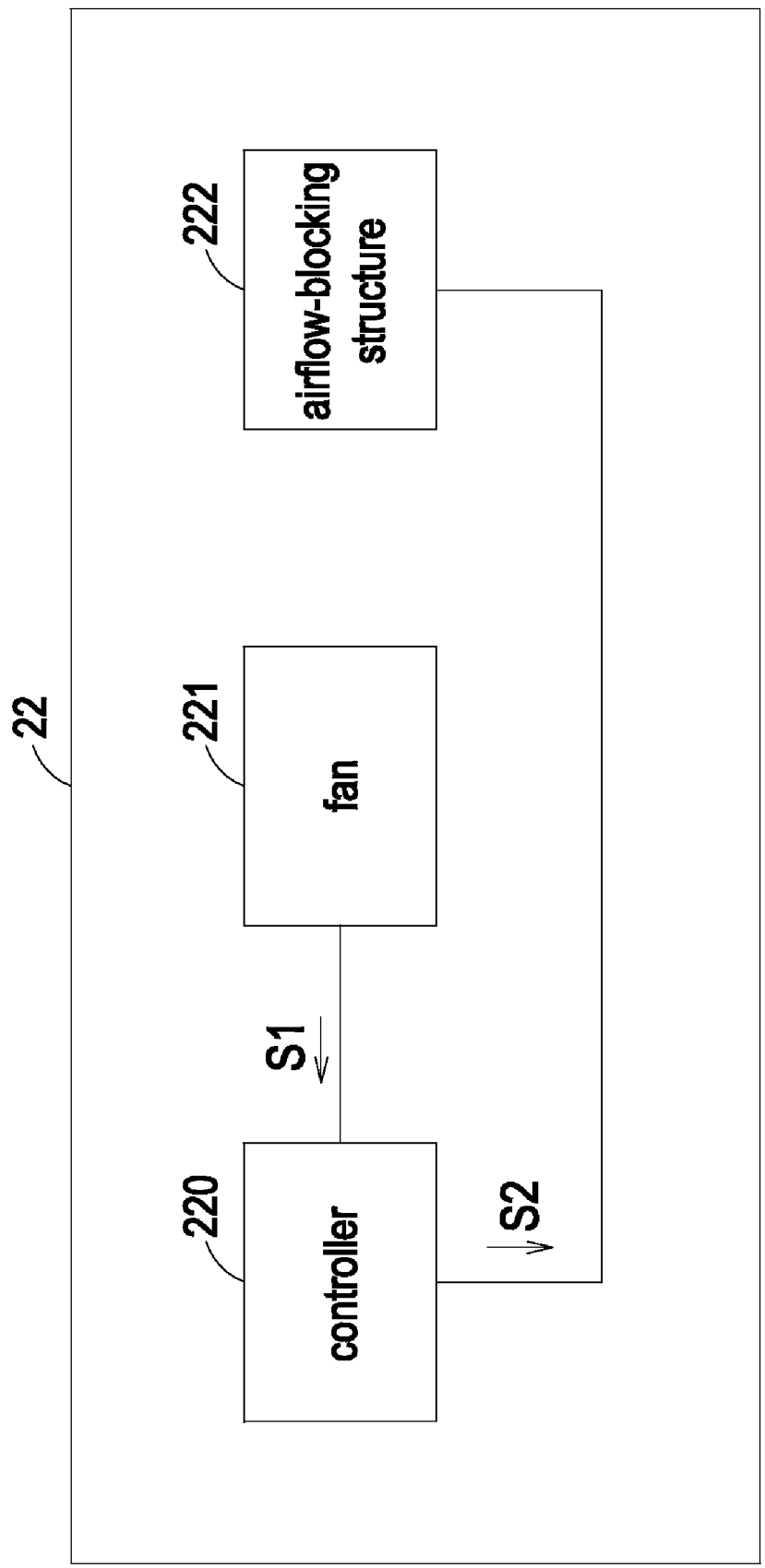
FIG. 6 is a schematic functional block diagram illustrating an exemplary controlling mechanism of the air conditioning system of the portable data center according to the present invention.

FIG. 6 is a schematic functional block diagram illustrating an exemplary controlling mechanism of the air conditioning system of the portable data center according to the present invention. As shown in FIG. 6, each of the airflow-driving devices 22 further comprises a controller 220. The controller 220 is electrically connected with the fan 221 and the airflow-blocking structure 222 of the corresponding airflow-driving device 22 for controlling on/off statuses of the fan 221 and open/close statuses of the airflow-blocking structure 222. In a case that the fan 221 of the airflow-driving device 22 is disabled (in a standby status or a maintaining status, or breakdown), a first signal S1 is issued from the disabled fan 221 to the controller 220. In response to the first signal S1, the controller 220 issues a second signal S2 to the airflow-blocking structure 222. In response to the second signal S2, the airflow-blocking structure 222 is closed. That is, in response to the second signal S2, the leaves 224 are adjusted to be substantially perpendicular to the airflow direction. Meanwhile, the leaves 224 fail to define the plural channels 225. As a consequence, the possibility of generating the low flow-resistance airflow path is minimized or eliminated, and the short-circulating problem is overcome.

Figure 7:
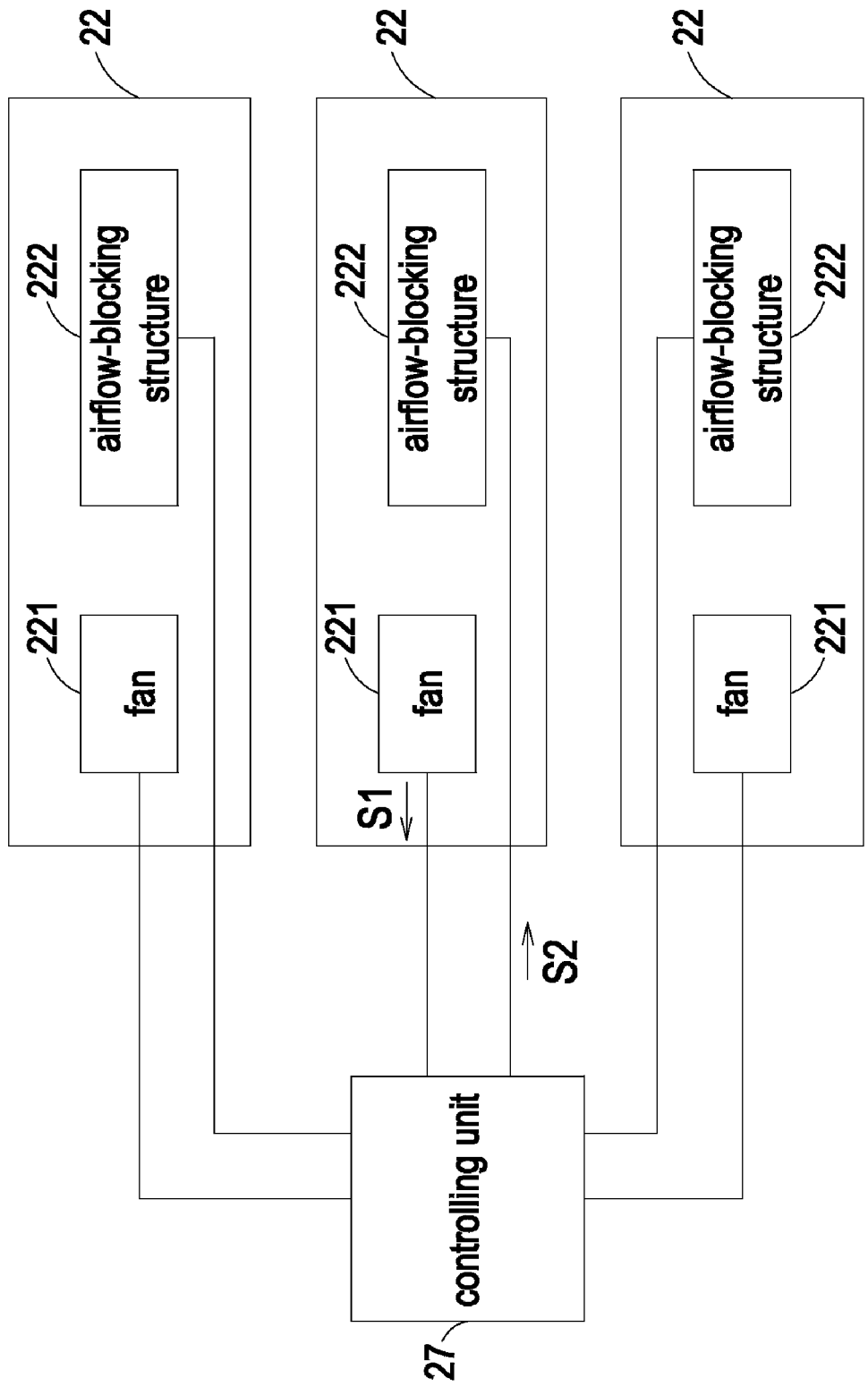
FIG. 7 is a schematic functional block diagram illustrating another exemplary controlling mechanism of the air conditioning system of the portable data center according to the present invention.

FIG. 7 is a schematic functional block diagram illustrating another exemplary controlling mechanism of the air conditioning system of the portable data center according to the present invention. As shown in FIG. 7, the air conditioning system of the portable data center further comprises a controlling unit 27. The controlling unit 27 is electrically connected with the fans 221 and the airflow-blocking structures 222 of all airflow-driving devices 22 for controlling on/off statuses of the fans 221 and open/close statuses of the airflow-blocking structures 222. For clarification, only three airflow-driving devices 22 are shown in FIG. 7. For example, the middle airflow-driving device 22 is disabled, and thus a first signal S1 is issued from the fan 221 of the disabled airflow-driving device 22 to the controlling unit 27. In response to the first signal S1, the controlling unit 27 issues a second signal S2 to the airflow-blocking structure 222 of the disabled airflow-driving device 22. In response to the second signal S2, the airflow-blocking structure 222 is closed. That is, in response to the second signal S2, the leaves 224 are adjusted to be substantially perpendicular to the airflow direction. Meanwhile, the leaves 224 fail to define the plural channels 225. As a consequence, the possibility of generating the low flow-resistance airflow path is minimized or eliminated, and the short-circulating problem is overcome.

From the above description, the air conditioning system of the portable data center of the present invention is capable of avoiding occurrence of the short-circulating problem if one of the airflow-driving devices is disabled, thereby increasing the cooling efficacy. In a case that one of the airflow-driving devices is disabled, the airflow-blocking structure of the disabled airflow-driving device is closed under control of the controlling unit of the air conditioning system or the controller of the disabled airflow-driving device. By closing the airflow-blocking structure, the low flow-resistance airflow path is blocked, and thus the cooled airflow exhausted out of the adjacent airflow-driving device fails to be introduced into the low flow-resistance airflow path. In other words, the performance of the air conditioning system will be maintained. As a consequence, the uses of the air conditioning system of the present invention are power-saving and cost-effective and have long use lives.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An air conditioning system of a portable data center, said air conditioning system comprising:
   a shipping container comprising a partition plate and a bottom plate, wherein said partition plate has plural hollow portions;
   plural data-processing devices disposed on said partition plate; and
   plural airflow-driving devices disposed under said partition plate and aligned with respective hollow portions for driving and guiding airflow to cool said data processing devices, wherein each of said airflow-driving devices comprises at least one fan, an airflow-blocking structure, and a mesh guard, wherein said mesh guard is disposed on said airflow-blocking structure to cover said airflow-blocking structure and used as a protecting cover of said airflow-blocking structure, wherein said airflow-blocking structure is arranged in an airflow path of a corresponding airflow-driving device, wherein if one of said airflow-driving devices is disabled, said airflow-blocking structure of said disabled airflow-driving device is automatically closed to hinder said airflow path.

2. The air conditioning system according to claim 1, further comprising a heat exchanger, which is arranged between said partition plate and said bottom plate for adjusting temperature of said airflow.

3. The air conditioning system according to claim 1, wherein said airflow-blocking structure is an air gate with plural movable leaves.

4. The air conditioning system according to claim 1, wherein said airflow-blocking structure is arranged adjacent to an airflow outlet of said corresponding airflow-driving device.

5. The air conditioning system according to claim 1, wherein each of said airflow-driving devices further comprises a controller, which is electrically connected with said fan and said airflow-blocking structure for controlling on/off statuses of said fan and open/close statuses of said airflow-blocking structure.

6. The air conditioning system according to claim 5, wherein if one of said airflow-driving devices is disabled, a first signal is issued from said fan of said disabled airflow-driving device to said controller, wherein in response to said first signal, said controller issues a second signal to said airflow-blocking structure, and in response to said second signal, said airflow-blocking structure is closed.

7. The air conditioning system according to claim 1, wherein said air conditioning system further comprises a controlling unit electrically connected with said fans and said airflow-blocking structures of said airflow-driving devices for controlling on/off statuses of said fans and open/close statuses of said airflow-blocking structures.

8. The air conditioning system according to claim 7, wherein if one of said airflow-driving devices is disabled, a first signal is issued from said fan of said disabled airflow-driving device to said controlling unit, wherein in response to said first signal, said controlling unit issues a second signal to said airflow-blocking structure of said disabled airflow-driving device, and in response to said second signal, said airflow-blocking structure is closed.

* * * * *